United States Patent [19]

Shatas

[11] Patent Number: 5,783,834

[45] Date of Patent: Jul. 21, 1998

[54] METHOD AND PROCESS FOR AUTOMATIC TRAINING OF PRECISE SPATIAL LOCATIONS TO A ROBOT

[75] Inventor: Steven C. Shatas, Santa Clara, Calif.

[73] Assignee: Modular Process Technology, San Jose, Calif.

[21] Appl. No.: 802,753

[22] Filed: Feb. 20, 1997

[51] Int. Cl.$^6$ ............................................. G01N 21/86
[52] U.S. Cl. ............................ 250/559.33; 250/559.29; 414/941; 901/47
[58] Field of Search .................. 250/559.33, 559.29, 250/559.37, 559.36; 414/936, 937, 939, 940, 947; 356/375; 901/30, 47, 46, 31, 3

[56] References Cited

U.S. PATENT DOCUMENTS 4,980,626 12/1990 Hess et al. ........................ 250/559.33

*Primary Examiner*—Que Le
*Attorney, Agent, or Firm*—Lumen Intellectual Property Service

[57] ABSTRACT

A robot with a moveable arm is taught precise position data for the various locations it must attain during operation. The arm moves vertically, radially and angularly and is provided with an end effector which is used to grip the object being transported by the robot. The end effector is modified to allow effective position training before normal operation and to provide a warning signal during normal operation. Horizontal locations are taught by recording the angular and radial coordinates at which a modified section of the end effector is lined up with a vertical locating beam. Vertical positions are taught by recording the vertical coordinates at which a second locating signal is detected at the front edge of the end effector. This signal also serves as a warning signal during normal operation.

36 Claims, 5 Drawing Sheets

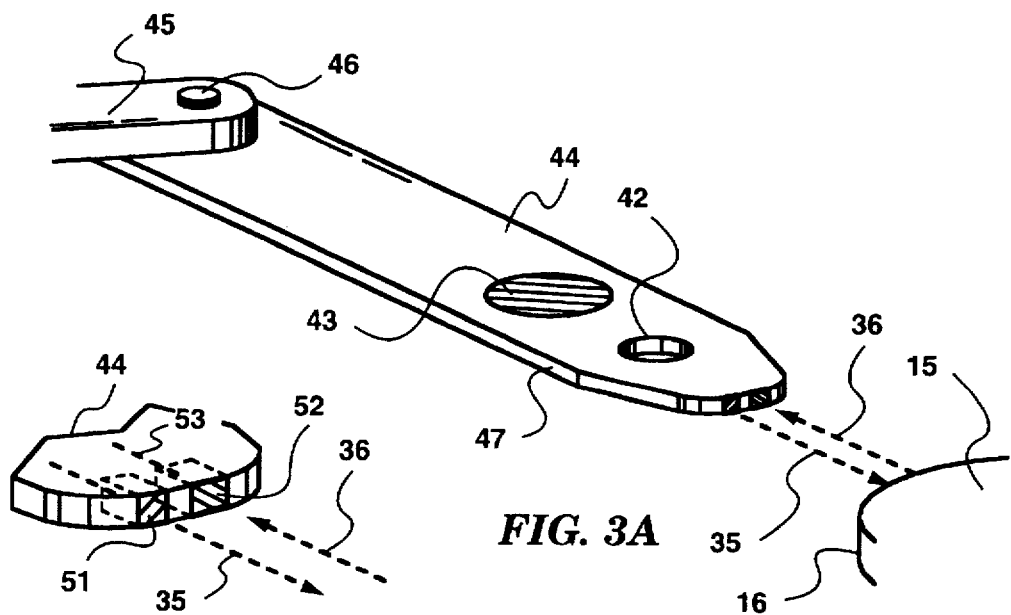
*FIG. 3A*
*FIG. 3B*
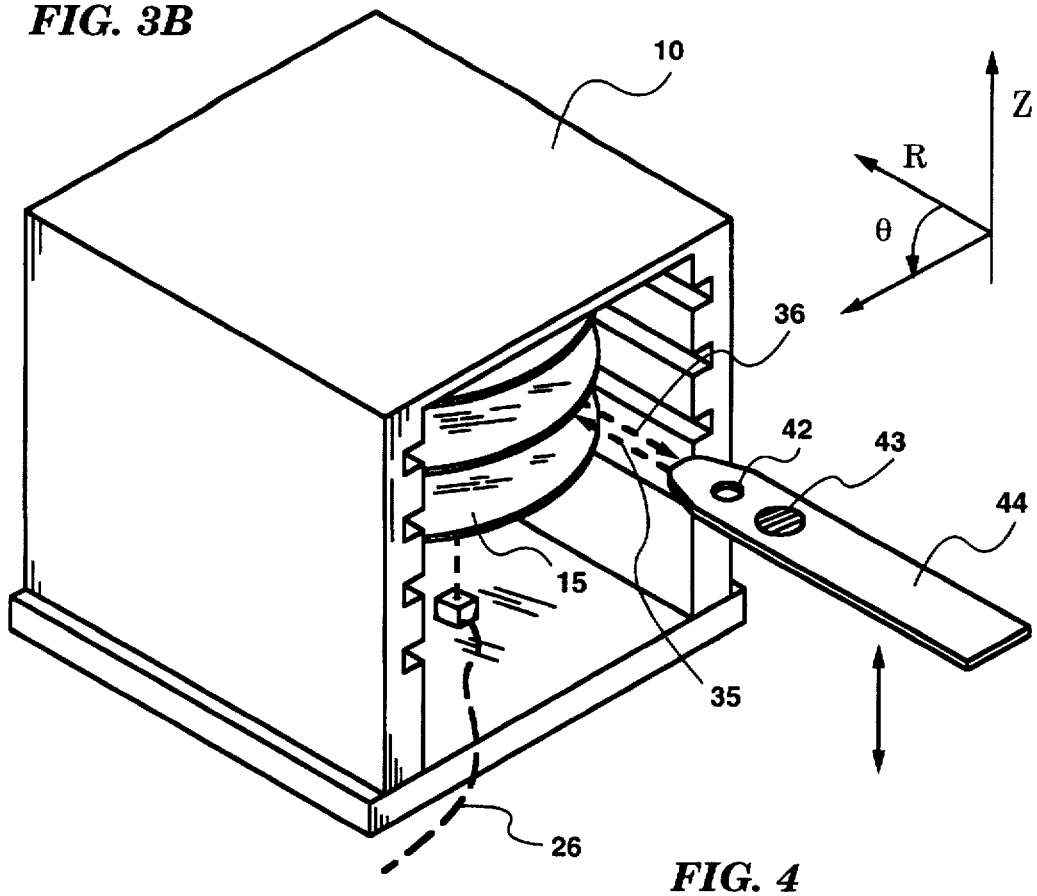
*FIG. 4*

METHOD AND PROCESS FOR AUTOMATIC TRAINING OF PRECISE SPATIAL LOCATIONS TO A ROBOT

FIELD OF THE INVENTION

This invention relates generally to automatic training of precise spatial locations in a work space to a robot, and in particular to a method and system for using the robot's end effector to establish the precise radial and angular coordinates (R, θ) and the vertical coordinate (Z) in the work space.

BACKGROUND OF THE INVENTION

The use of robots is convenient wherever and whenever the operations to be executed are high-precision or repetitive, tedious, stressful or otherwise hazardous to humans. Industries such as automobile manufacturing, production and assembly of integrated circuits, material handling and many others have employed industrial robots to improve efficiency and increase productivity.

One of the simplest types of industrial robots is the so-called "pick and place" robot. This type of robot may be, for example, electrically, pneumatically or hydraulically driven and is usually characterized by movement between predetermined limits set by hard stops or micro switches.

Another type of robot is a "continuous path" robot, which is more sophisticated in that it can be driven to many different positions within its operating space. A large variety of "pick and place" robots and "continuous path" robots are currently in use.

Most robots share the same basic design; a base with a movable arm attached to it. The arm typically includes a number of rigid bodies or segments connected by joints with a tool or end effector usually mounted on the last segment. While the base is stationary, the joints are free to move in "revolute" or "prismatic" fashion. Revolute joints are hinged; they may be compared to human elbows and knees. Prismatic joints are telescopic or extendible; they may be compared to telescopes.

The end effector is typically provided with a joint and is free to move. This tool is like the hand of the robot and may include a mounted gripper or some other device useful for manipulating objects. For example, end effectors for handling semiconductor wafers or other objects with flat and smooth surfaces are equipped with a vacuum chuck or other means for holding and supporting the wafer or object to be transported. After grasping the object with the gripper, the robot can move or change the position of the object.

When the robot is automated or computer-programmed, it can be made to perform these tasks repeatedly. This is advantageous, but requires a few preparatory steps. In particular, the robot has first to be "shown" or "taught" what to do.

According to a simple teaching method, the robot is taken through its operational path, from the point where the end effector grasps the object or workpiece to the point where it releases it. At certain points in its operation path, the robot is stopped and the joint values are recorded. Many conventional robots have internal systems that automatically report joint values. These joint values can be fed to the robot memory for later reference. When the time comes for the robot to do its job, it "remembers" the joint values that correspond to the desired position and performs its task accordingly.

Another teaching method, frequently referred to as "work space calibration", relies on observing the position of the end effector with respect to a fixture in the operating space. The observations are recorded in a suitable coordinate system. Unfortunately, this teaching method relies on making accurate position measurements of the end effector from a remote location. Although these measurements are typically performed with the aid of high-precision sonic or optical systems, the results are frequently insufficient for mapping out end effector operations when small parts or tight tolerances are required.

Robot reliability can also be improved by "telling" the robot how to perform a given task. This is usually better than "showing" because it can be done automatically, e.g., by computer. Unfortunately, this approach is also more complicated. The mechanical relationships, i.e., the distances and angles between the joints must be converted to mathematical relationships. When robots are "told" how to move, they are instructed using a mathematical language. If that language is not accurately translated into mechanical language, the manipulator will not move as it is told. In situations where precision is important and workpieces expensive, even small missteps can result in damage to the manipulator or the object.

Yet another technique of calibrating a robot arm is called "kinematic calibration". This method relies on mapping joint configurations. Essentially, the mapping is done by measuring joint-tool relationships at a number of locations and performing a regression analysis to fit model parameters to the measurements. Various mathematical algorithms are available for calibration, however, prior to this step, the joint-tool measurements, or "position data" must be collected.

The entire teaching or calibration process has to be repeated when components, especially arm segments, or the end effector are replaced. Changes in the work space, e.g., different workpiece configuration or space geometry, also require the robot to be retrained.

From the above discussion, it is clear that robot reaching is fundamental and crucial to error-free operation. In particular, the teaching apparatus and method should be quick, reliable, simple and easy to repeat at any point in time. When completed, the robot should possess the precise position data of the end effector at all the necessary locations.

In U.S. Pat. No. 4,685,862 Nagai et al. disclose how to teach position data to an industrial robot having a movable arm. For this purpose a support member on the arm is provided with a through-hole to accommodate an optical magnifying device for aligning the arm in a proper position. The operator inserts the optical magnifying device and makes sure that the center of a reference hole on a pallet is properly aligned. When done, the optical device is removed and the gripping member or manipulating device is inserted into the through-hole.

There are several disadvantages to this training method. First and foremost, it relies on the ability of a human operator to properly align elements. This introduces the possibility of human error and requires a considerable amount of time when many locations are to be trained. Further, the optical magnifying device is removed once the training cycle is complete. Although the manipulator or end effector is placed in the same through-hole as the optical device, there is a probability that the eventual positioning of the manipulator will not correspond to that which was assumed when performing the alignment with the optical device. In addition, the simple action of inserting and removing the optical device and the tool can lead to errors.

Thus, the teaching method of Nagai et al. is not satisfactory for high-precision robot training.

U.S. Pat. No. 5,177,563 to Everett et al. shows how to calibrate a robot manipulator using a special fixture temporarily mounted on the end effector or manipulator. The fixture has at least three sensors for making tangential contact with a curved surface, most commonly a sphere.

Although this method does not rely on the operator, it still incurs many disadvantages. The fixture for performing the measurement has to be attached to the end effector during the training cycle. The removal of the fixture may disturb the robot arm and alter the location values obtained sufficiently to preclude the use of this method in high-precision applications. Furthermore, no old positions can be retrained or new positions trained without stopping the robot and attaching the special fixture. When the work space is a clean room or a high pressure chamber, this means that the entire work cycle has to be interrupted.

From the above discussion it is clear that the most reliable way to train location data is by performing the measurements from the end effector itself in the very same arrangement as is going to be used during operation. It would also be desirable to retain the original training system or the operable part thereof on the end effector to be of use during the work cycles, e.g., to serve as a warning system when the end effector is out of position. This would be especially desirable in a robot employed to operate with very expensive materials in sensitive environments, e.g., a robot for handling semiconductor wafers in a multi-station chamber.

OBJECTS AND ADVANTAGES OF THE INVENTION

Accordingly, it is a primary object of the present invention to provide an apparatus and method for teaching positions to a robot with an end effector without disturbing the end effector. No special elements or sensors are attached to the end effector to perform the training cycle. In other words, the equipment mounted in or on the end effector for training purposes is permanent.

It is another object of the invention to ensure that the equipment provided in or on the end effector for training purposes can be used continuously during operation. In particular, the equipment on the end effector is used to warn of improper end effector position.

Still another object of the invention is to ensure that the equipment necessary to perform the training functions is easy-to-use, low-cost and does not interfere with the robot's regular operation in any way. In particular, the apparatus and method of invention are applicable to semiconductor wafer handling robots operating in multi-station chambers.

These and other objects and advantages will become more apparent after consideration of the ensuing description and the accompanying drawings.

SUMMARY OF THE INVENTION

An apparatus and method are disclosed for automatically training precise spatial locations to a robot. Mounted on a robotic arm is an end effector which is used to transport silicon wafers to and from wafer cassettes in a clean process chamber. The end effector has a chuck that serves to grip the wafer. Machined into the end effector is also a through-hole which allows a signal, for example a beam of light, to pass through.

Within the wafer cassette, a narrow beam is projected vertically from a source to a detector. This beam marks the horizontal location which must be attained by the hole in the end effector in order for the wafer gripped by the chuck to be located properly within the cassette. During training, the robot is taught the horizontal position it must attain by moving the end effector until the beam passes through the hole and is thus detected by the detector below.

Embedded within the front edge of the end effector is a second signal source and detector pair. The beam emitted from this source will reflect off a wafer back to the detector in the event that a wafer is located in front of the end effector. Using this emitter/detector pair, and having established the horizontal (or radial and angular) location of the wafers, the robot is taught the vertical locations of the wafers by scanning a full cassette and recording the locations at which a signal is reflected. During normal operation, a signal reflected off the edge of a wafer will constitute a warning signal thereby allowing the end effector to avoid undesirable contact with the wafers.

DESCRIPTION OF THE FIGURES

FIG. 3 is a three dimensional view of the end effector showing the emitter/detector pair.

FIG. 3B is an enlarged view of the tip of the end effector of FIG. 3A.

FIG. 4 is a three dimensional view of the station and the end effector demonstrating vertical position learning.

DETAILED DESCRIPTION

Figure 1:
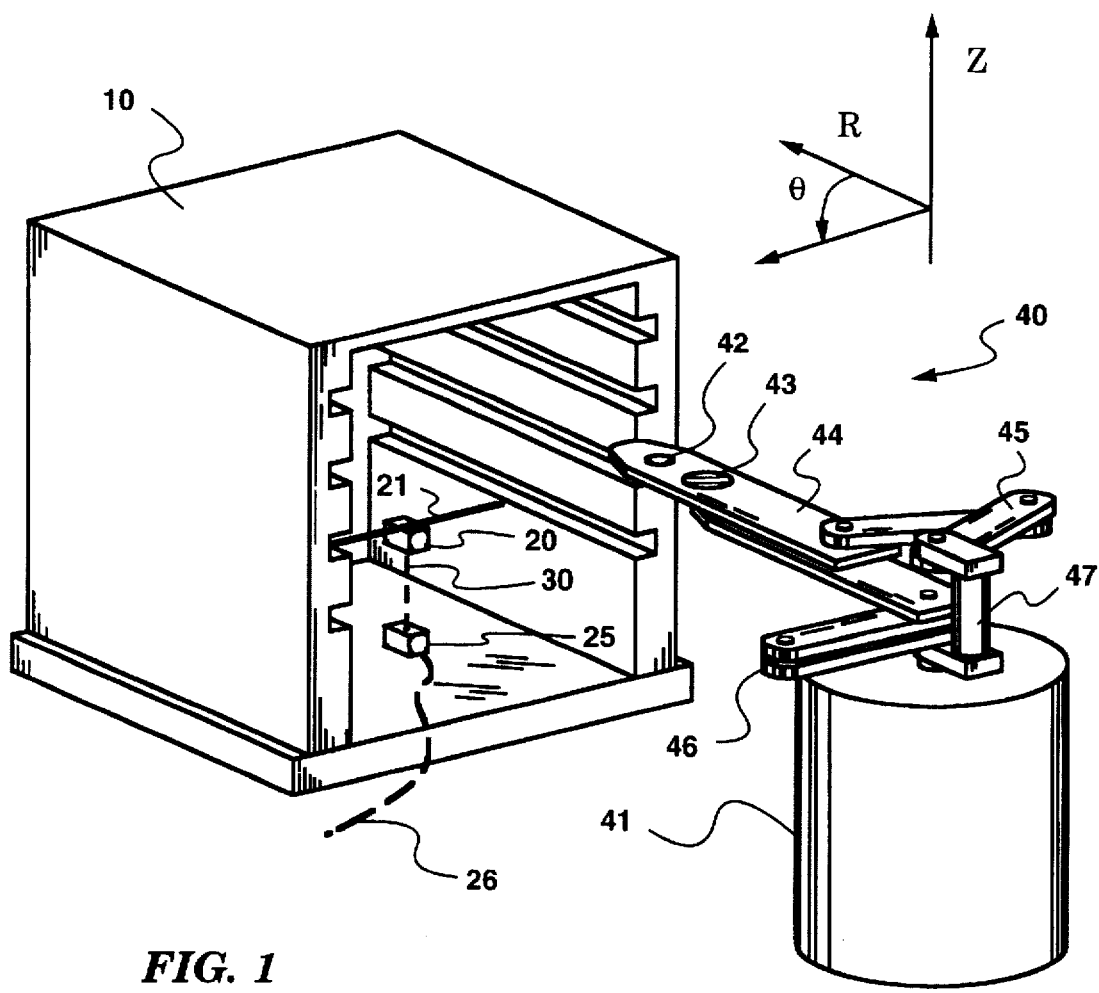
FIG. 1 is a three dimensional view of an embodiment of the robot apparatus according to the invention.

FIG. 1 shows an empty wafer cassette 10, a first signal source 20 and a first signal detector 25 and a robot 40 which moves an end effector 44.

In the embodiment shown in FIG. 1, the robot 40 is comprised of a set of revolute segments 45 connected by joints 46 and mounted on a base 41. The robot is controlled remotely by means of a robotic controller (not shown). Mounted on the robot 40 is the end effector 44 which is used to transport wafers in and out of the wafer cassette 10. The robot 40 can move the end effector 44 radially by extending the revolute segments 45. The end effector can be moved angularly by rotating the robot base 41.

Vertical motion is achieved by raising and lowering the base 41. The design of the robot 40 is not essential to the invention as long as it provides adequate means for moving the end effector 44 radially, angularly and vertically. A person skilled in the art will be able to design their own robot. Moreover, robots of this type are commonly available.

Figure 2:
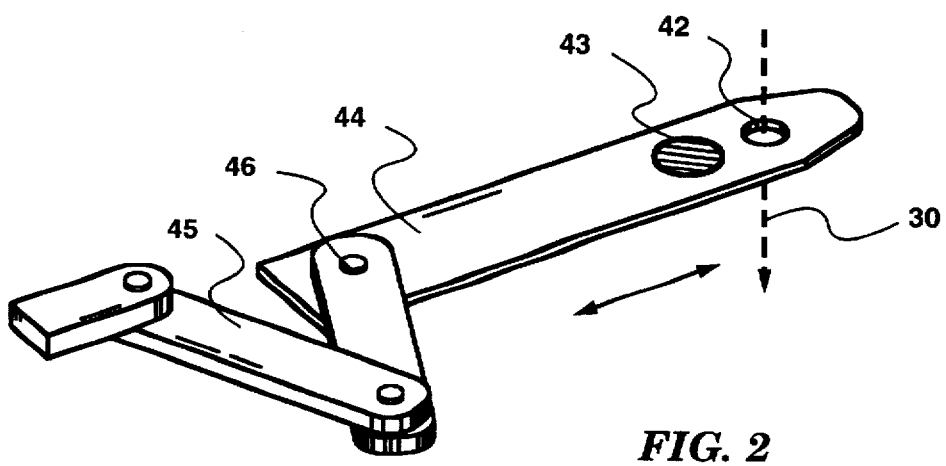
FIG. 2 is a three dimensional view of the end effector showing the through hole at the end of the end effector allowing horizontal position learning.

The end effector 44 is equipped with a vacuum chuck 43 for gripping wafers (not shown in FIG. 1). Although, the vacuum chuck 43 is shown in this embodiment, any means of holding the wafer to the end effector 44 securely would suffice. Moreover, a vacuum chuck can only be used in a chamber with an atmosphere. A person skilled in the art will be able to select the proper chuck. The end effector 44 also has a round through-hole 42 near the end closest to the cassette 10. This hole is large enough to allow a first locating beam 30 to pass through as shown in FIG. 2.

Within the cassette 10, the lower portion is left empty for wafer conditioning. In this lower portion of the cassette 10 first locating beam 30 is emitted from a first signal source 20 and detected by a first detector 25. When the locating beam 30 is detected by the first detector 25, a signal 26 is transmitted to the robot controller (not shown). In the embodiment shown, first locating beam 30 is a beam of light.

This first locating beam 30 indicates the position in the horizontal (X-Y) plane that the through-hole 42 in the end effector 44 must attain to place a wafer 15 (see FIG. 3) properly in the cassette 10. As shown in FIG. 2 when the end effector has achieved the correct location in the horizontal plane, the first beam 30 will pass directly through the hole 42 at the end of the end effector 44. The robot can therefore be taught the correct horizontal location to attain, by moving the end effector in the horizontal plane until the first locating beam 30 passes through the through hole 42 and is detected by the first detector 25. Since the robot 40 moves the end effector 44 radially and angularly, the learned horizontal locations are stored as radial and angular coordinates.

In the embodiment shown, the first locating beam 30 is intended to pass through hole 42 on the end effector 44 and be detected by the first detector 25. However, it would also be possible to replace the first signal source 20 with an emitter/detector pair and replace the hole 42 on the end effector 44 with a reflector such that first beam 30 is reflected back when the end effector 44 is in the correct location.

FIG. 3A shows the end effector 44 and the wafer 15. The end effector has an edge 47. Embedded in the front of the end effector edge 47 is a second beam source 51 and second detector 52 as shown in detail in FIG. 3B. As shown in FIG. 3A, a second beam 35 is emitted radially from the end of the end effector 44. The second beam 35 therefore propagates directly in front of the end effector 44. In the embodiment shown, the second locating beam 35 is a beam of light. Light sources 51 and detectors 52 which can be embedded within the end effector 44 are available off the shelf. However, it is possible to use an ultrasonic beam as well without departing from the scope of the invention.

FIG. 3A an 3B also demonstrates how the second locating beam 35 emitted by the second source 51 is reflected off an edge 16 of the wafer 15. A reflected beam 36 is then detected by the second detector 52. Detection of reflected beam 36 therefore indicates the presence of one wafer 15 directly in front of the end effector 44. The detector signal is then transmitted back to the robotic controller via second detector signal 53.

As shown in FIG. 4, once the robot 40 knows the angular position of the wafers 15 in the cassette 10 the robot 40 can be taught the appropriate vertical locations for wafer cassette 10 by scanning vertically up and down the wafer cassette 10 and detecting the presence of wafers 15. The appropriate vertical position for the end effector 44 can then be computed by subtracting one half the thickness of the end effector 44 from the vertical location of the wafers 15.

Figure 5:
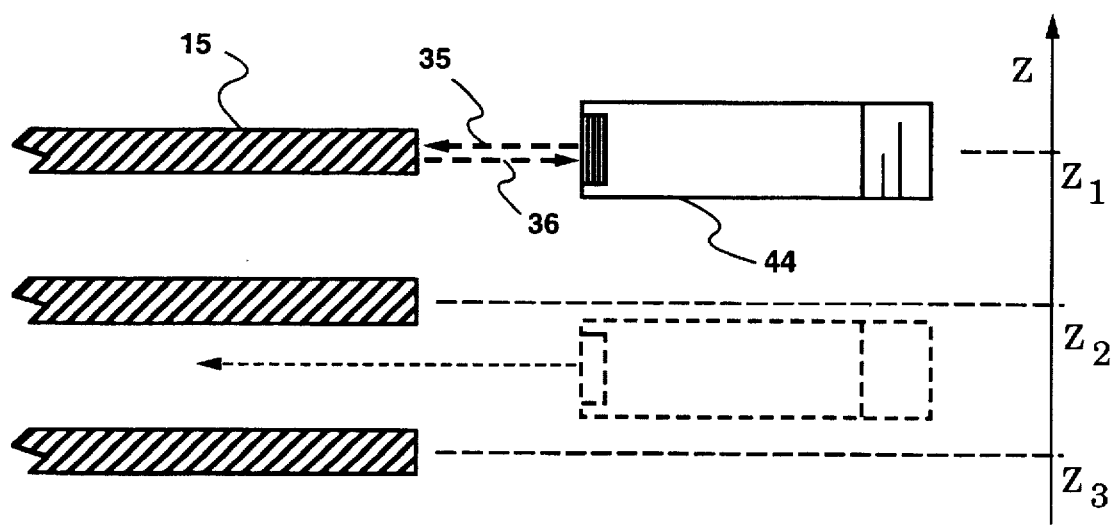
FIG. 5 is a cut away view of the end effector showing the operation of the emitter/detectors on the end of the end effector.

FIG. 5 shows a cut away view of the wafers 15 and the end effector 44. As shown in FIG. 5 second locating beam 35 is reflected off the edge 16 of the wafer 15 back to the second detector 52 as reflected beam 36. The detection of reflected beam 36 indicates the vertical locations of the wafers marked as $Z_1$, $Z_2$ and $Z_3$. Also shown with dashed lines, when no wafer 15 is directly in front of the end effector 44, beam 35 is not reflected and therefore no reflected beam 36 is detected by the second detector 52.

The second beams 35 and 36 are used not only for teaching the vertical locations of the wafers, but also as warning signals during normal operation. When the end effector 44 approaches a wafer 15, the second beam 35 will be reflected back to the second detector 52. The detector signal thus constitutes a warning allowing the end effector 44 to avoid undesired contact with the wafers 15 during operation. For example, if during normal operation, the end effector 44 was approaching a wafer 15, the presence of the wafer 15 would be detected by means of reflected beam 36. Signal 52 would thus be a warning signal which might cause robot 40 to stop if its radial and angular position indicated that it was indeed close to the wafers 15.

Figure 6:
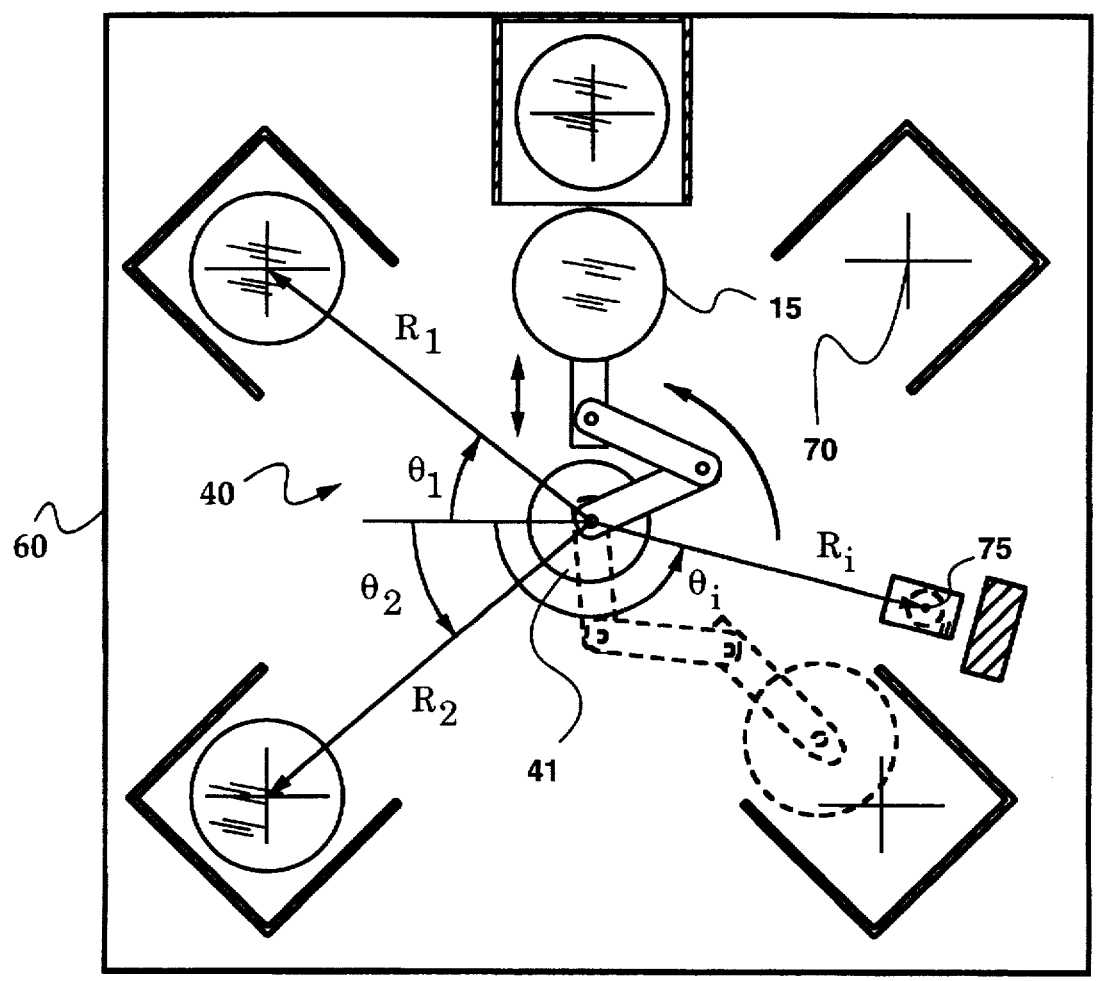
FIG. 6 is a top view of a processing chamber with robotic arm showing planar position learning.

FIG. 6 shows a top view of a process chamber 60 with the robot 40. Indicated by crosses 70 are the horizontal locations of the wafers 15. The robot 40 is taught these locations by moving sequentially from one cassette 10 to another. For each cassette, the end effector 44 is moved until the first locating beam 30 passes through the through-hole 42 (as explained above). This position is recorded by noting the radial and angular location (R,Θ) at which the first signal 30 passes through the hole 42 of the end effector 44. The location of the center of the wafer 15 can be calculated by subtracting the distance between the chuck 43 and the hole 42 from the radial location of the signal 30. As shown in FIG. 6 the robot can be trained to any location 75 ($R_i$, $Θ_i$). Therefore, the robot 44 could be trained to follow a particular trajectory by establishing intermediate locations 75 it must attain.

Figure 7:
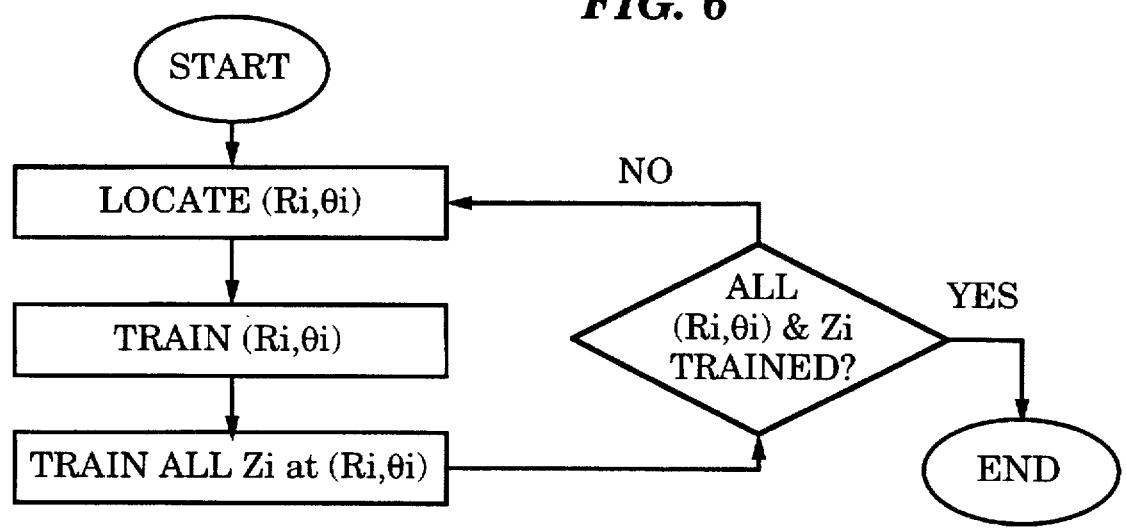
FIG. 7 is flow chart of end position learning according to the invention.

FIG. 7 is a flow chart of the steps required to teach the desired locations to the robot 40. The first step is to establish the radial and angular positions ($R_i$, $Θ_i$) which the hole 42 in the end effector 44 must attain. These are the locations at which the first locating beams 30 are detected by the first detectors 25 having passed through the hole at the end of the end effector 44. This is done by moving the end effector 44 to the lower portion of the wafer cassette 10 and then scanning the area—by adjusting the radius and angular positions of the end effector—until the beam 30 passes through the hole 42. The robot is then trained by recording these radial and angular positions ($R_i$, $_i$) at which the signal 26 is strongest, the beam 30 having passed through the hole 42 in the end effector 44.

Having established the angular positions of the wafers 15, the robot then scans up the cassette 10 to establish the vertical positions $Z_i$ of the wafers 15. This is accomplished by pointing the end effector 44 in the direction $Θ_i$ of the wafers 15, but extending the end effector no more than the radial location of the wafer $R_i$ minus the radius of the wafer. For example, if the centers of the wafers 15 in the first cassette 10 are located at ($R_1$,$Θ_1$)=(5m, 45°) and the wafers are 200 mm in diameter, the end effector 44 would be pointed at 45 and extended no further than 5 m−100 mm=4.9 m. During training, it is desirable to extend the end effector 44 close to the wafers 15 to ensure good signal quality, however in practice it is best to keep a safe distance from the cassette in order to ensure that no damage occurs. In the preferred embodiment, the end effector 44 is kept one half to one centimeter (0.5–1.0 cm) from the wafers during Z-position training. Therefore, in the example given, the end effector would be extended to position (4.89 m, 45°).

The vertical locations are taught to the robot by maintaining the radial and angular position and moving the end effector 44 vertically until the second locating beam 35 is reflected by the edge 16 of each wafer 15 in the cassette 10. Once the vertical coordinate of each of these locations is recorded, the robot has been taught exactly where it has to go to transport wafers 15 to and from the cassette 10.

Figure 8:
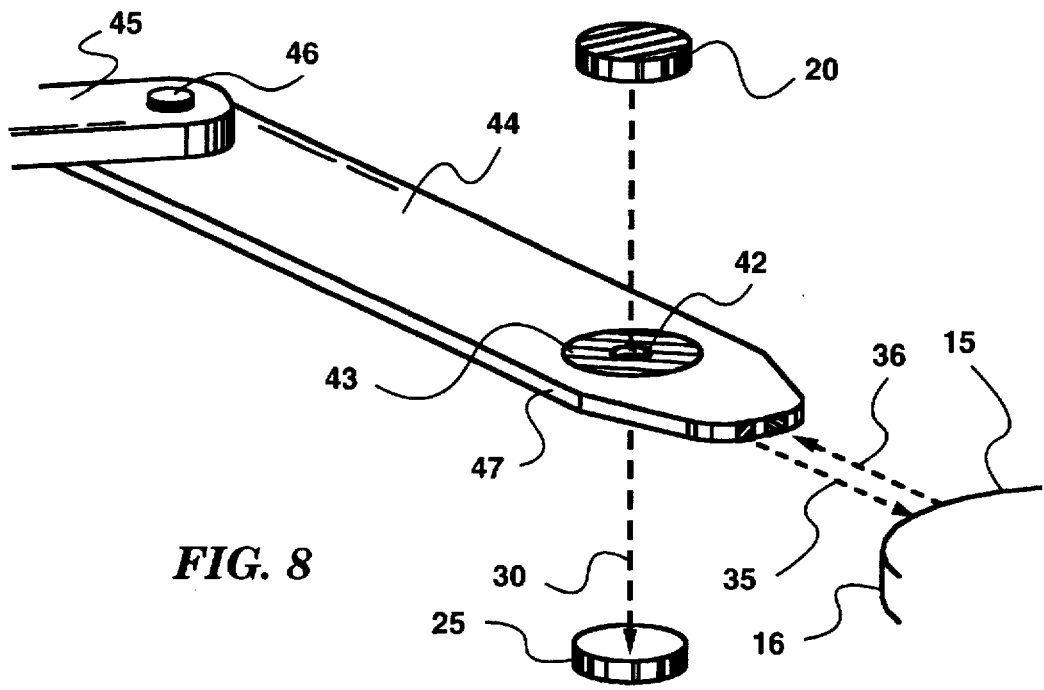
FIG. 8 is a three dimensional view of the end effector showing an alternative design for the through hole and vacuum chuck.

FIG. 8 shows an alternative embodiment for the end effector 44 where the through hole 42 is located at the center of the chuck 43. In this case, the first signal 30 would be located at the planar center of the wafers 15 in the cassette 10.

Figure 9:
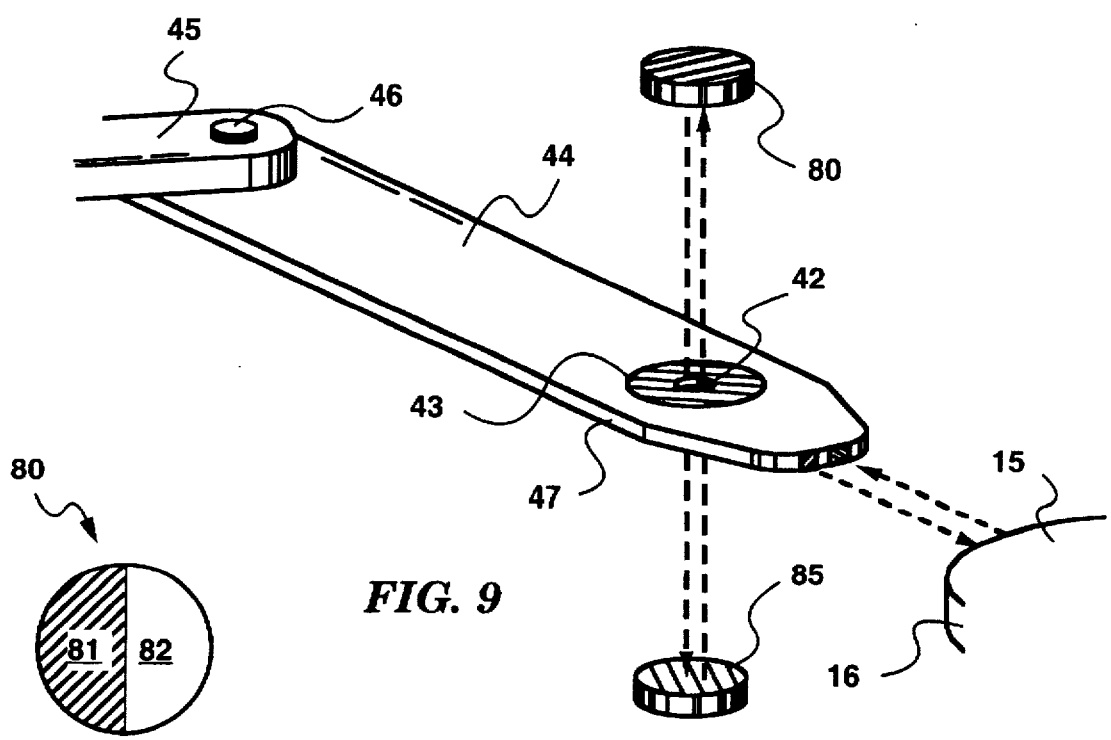
FIG. 9 is a three dimensional view of the end effector showing an alternative design for the through hole and vacuum chuck.
Figure 10:
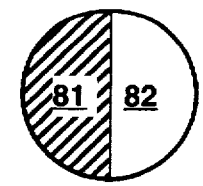
FIG. 10 is a plan view of an emitter/detector pair.

FIG. 9 shows yet another embodiment in which the first signal source 20 is replaced by a first emitter/detector pair 80. As better shown in the plain view of FIG. 10, emitter/detector pair 80 consist of an emitter 81 and a detector 82; these can be of the same type as emitter and detector 51, 52 discussed above. Likewise, first signal detector 25 is replaced by an emitter/detector pair 85.

It will be clear to one skilled in the art that the above embodiment may be altered in many ways without departing from the scope of the invention. For example, the end effector may be moved radially by means of a telescopic arm. Moreover, the system may be used in conjunction with other training methods to achieve fine tuning of exact spatial locations. The system may also be used to provide signals to a fully automated training system. Accordingly, the scope of the invention should be determined by the following claims and their legal equivalents.

What is claimed is:

1. An apparatus for teaching a spatial location to a robot having an arm equipped with an end effector operating in a work space where said spatial location is defined by planar coordinates and by a vertical coordinate, said apparatus comprising:
   a) a first signal source for generating a first locating beam;
   b) a through-hole in said end effector for passing said first locating beam when said end effector is at a desired planar position;
   c) a first signal intercepting means for intercepting said first locating beam after said first locating beam has passed said through-hole;
   d) a second signal source mounted on said end effector for generating a second locating beam;
   e) a vertical calibration means for reflecting said second locating beam when said end effector is at a desired vertical position; and
   f) a second signal intercepting means mounted on said end effector for intercepting said second locating beam after said second locating beam has been reflected.

2. The apparatus of claim 1 wherein said planar coordinates comprise a radius R and an angle θ, and said vertical coordinate comprises a height Z.

3. The apparatus of claim 1 wherein said first signal source is a first light source and said first locating beam is a first light beam.

4. The apparatus of claim 3 wherein said first signal intercepting means is a reflector for reflecting said first light beam back to said first light source and said apparatus further comprises a photo detector at said first light source for detecting said first light beam after reflection from said reflector and for generating a first teaching signal.

5. The apparatus of claim 3 wherein said first intercepting means is a first photo detector for detecting said first light beam and generating a first teaching signal.

6. The apparatus of claim 1 wherein said second signal source is a second light source, said second signal beam is a second light beam and said second intercepting means is a second photo detector for generating a second teaching signal.

7. The apparatus of claim 1 wherein said second signal source is a second sonic source, said second signal beam is a second sonic beam and said second intercepting means is a second sonic detector for generating a second teaching signal.

8. The apparatus of claim 1 wherein said second signal source and said second intercepting means are mounted at the front edge of said end effector.

9. The apparatus of claim 1 wherein said vertical calibration means comprises a processing station with workpieces to be handled by said end effector.

10. The apparatus of claim 9 wherein said workpieces are semiconductor wafers and said second locating beam is reflected by the edges of said semiconductor wafers.

11. The apparatus of claim 1 wherein said work space is defined by a processing chamber.

12. An apparatus for teaching a spatial location to a robot having an arm equipped with an end effector operating in a work space where said spatial location is defined by planar coordinates and by a vertical coordinate, said apparatus comprising:
   a) a first signal source for generating a first locating beam;
   b) a reflecting means on said end effector for reflecting said first locating beam when said end effector is at a desired planar position;
   c) a first signal intercepting means for intercepting said first locating beam after said first locating beam has been reflected by said reflecting means;
   d) a second signal source mounted on said end effector for generating a second locating beam;
   e) a vertical calibration means for reflecting said second locating beam when said end effector is at a desired vertical position; and
   f) a second signal intercepting means mounted on said end effector for intercepting said second locating beam after said second locating beam has been reflected.

13. The apparatus of claim 12 wherein said planar coordinates comprise a radius R and an angle θ, and said vertical coordinate comprises a height Z.

14. The apparatus of claim 12 wherein said first signal source is a first light source and said first locating beam is a first light beam.

15. The apparatus of claim 14 wherein said first intercepting means is a first photo detector for detecting said first light beam and generating a first teaching signal.

16. The apparatus of claim 12 wherein said second signal source is a second light source, said second signal beam is a second light beam and said second intercepting means is a second photo detector for generating a second teaching signal.

17. The apparatus of claim 12 wherein said second signal source is a second sonic source, said second signal beam is a second sonic beam and said second intercepting means is a second sonic detector for generating a second teaching signal.

18. The apparatus of claim 12 wherein said second signal source and said second intercepting means are mounted at the front edge of said end effector.

19. The apparatus of claim 12 wherein said vertical calibration means comprises a processing station with workpieces to be handled by said end effector.

20. The apparatus of claim 19 wherein said workpieces are semiconductor wafers and said second locating beam is reflected by the edges of said semiconductor wafers.

21. The apparatus of claim 1 wherein said work space is defined by a processing chamber.

22. A method for teaching a spatial location to a robot having an arm equipped with an end effector operating in a work space where said spatial location is defined by planar coordinates and by a vertical coordinate, said method comprising the following steps:
 a) generating a first locating beam using a first signal source;
 b) providing a through-hole in said end effector for passing said first locating beam when said end effector is at a desired planar position;
 c) intercepting said first locating beam after said first locating beam has passed said through-hole;
 d) generating a second locating beam using a second signal source mounted on said end effector;
 e) reflecting said second locating beam from a vertical calibration means when said end effector is at a desired vertical position; and
 f) intercepting said second locating beam after said second locating beam has been reflected.

23. The method of claim 22 wherein said planar coordinates comprise a radius R and an angle $\theta$, and said vertical coordinate comprises a height Z.

24. The method of claim 22 wherein said first signal source is a first light source and said first locating beam is a first light beam.

25. The method of claim 24 wherein said first intercepting means is a reflector such that said first light beam is reflected back to said first light source and said method further comprises the step of detecting said first light beam after reflection from said reflector by a photo detector mounted at said first light source and generating a first teaching signal.

26. The method of claim 24 wherein said first intercepting means is a first photo detector for detecting said first light beam and generating a first teaching signal.

27. The method of claim 22 wherein said second signal source is a second light source, said second signal beam is a second light beam and said second intercepting means is a second photo detector for generating a second teaching signal.

28. The method of claim 22 wherein said desired planar position is determined before determining said desired vertical position.

29. The method of claim 22 wherein said second locating beam propagates in the plane defined by said planar coordinates, and said method further comprises the steps of:
 a) emitting said second locating beam while said robot is in operation; and
 b) generating a warning signal when said second locating beam is reflected to said second intercepting means.

30. A method for teaching a spatial location to a robot having an arm equipped with an end effector operating in a work space where said spatial location is defined by planar coordinates and by a vertical coordinate, said method comprising the following steps:
 a) generating a first locating beam using a first signal source;
 b) providing a reflecting means on said end effector for reflecting said first locating beam when said end effector is at a desired planar position;
 c) intercepting said first locating beam after said first locating beam has been reflected by said reflecting means;
 d) generating a second locating beam using a second signal source mounted on said end effector;
 e) reflecting said second locating beam from a vertical calibration means when said end effector is at a desired vertical position; and
 f) intercepting said second locating beam after said second locating beam has been reflected.

31. The method of claim 30 wherein said planar coordinates comprise a radius R and an angle $\theta$, and said vertical coordinate comprises a height Z.

32. The method of claim 30 wherein said first signal source is a first light source and said first locating beam is a first light beam.

33. The method of claim 32 wherein said first intercepting means is a first photo detector for detecting said first light beam and generating a first teaching signal.

34. The method of claim 30 wherein said second signal source is a second light source, said second signal beam is a second light beam and said second intercepting means is a second photo detector for generating a second teaching signal.

35. The method of claim 30 wherein said desired planar position is determined before determining said desired vertical position.

36. The method of claim 30 wherein said second locating beam propagates in the plane defined by said planar coordinates, and said method further comprises the steps of:
 a) emitting said second locating beam while said robot is in operation; and
 b) generating a warning signal when said second locating beam is reflected to said second intercepting means.

* * * * *